United States Patent [19]
Yoshizawa et al.

[11] 4,168,534
[45] Sep. 18, 1979

[54] SHIFT REGISTER TYPE MEMORY DEVICE CONSISTING OF A PLURALITY OF MEMORY CHIPS

[75] Inventors: Shigeru Yoshizawa, Tokorozawa; Nobuo Saito, Mitaka, both of Japan

[73] Assignees: Hitachi, Ltd.; Nippon Telegraph and Telephone Public Corporation, both of Japan

[21] Appl. No.: 786,503

[22] Filed: Apr. 11, 1977

[30] Foreign Application Priority Data
Apr. 23, 1976 [JP] Japan .................................. 51/45517
Nov. 15, 1976 [JP] Japan ................................. 51/136309

[51] Int. Cl.² ............................................ G11C 19/08
[52] U.S. Cl. ..................................................... 365/15
[58] Field of Search ................ 340/174 TF; 365/1, 15

[56] References Cited
U.S. PATENT DOCUMENTS
4,070,651  1/1978  Naden ..................................... 365/15
4,073,012  2/1978  Ohnigian ................................ 365/15

FOREIGN PATENT DOCUMENTS
2307332  5/1976  France ................................. 340/174 TF

*Primary Examiner*—James W. Moffitt
*Attorney, Agent, or Firm*—Craig and Antonelli

[57] ABSTRACT

In a shift register type memory device wherein a plurality of chips are connected to a single sense amplifier and wherein data to be stored is cyclically written into the chips, then when a predetermined loop within a chip for stored designated data is defective, the data is not stored in a loop within the chip adjacent to the defective loop, but is stored in a loop to be subsequently read out in a chip to be read out subsequently to the chip having the defective loop.

9 Claims, 14 Drawing Figures

FIG. 2B 0 2 4 x 7 ... 107 109 110 254
BIT POSITION →

FIG. 2C 1 3 5 6 8 ... 108 x 111 253 255
BIT POSITION →

CHIP 1    0 0 0 0 1 1 0
CHIP 2                  0 1 1 0 1 1 1 1
DOUT
          └── NO. 6 ──┘ └── NO. 111 ──┘

| DOUT 1 | 0 | | 2 | | 4 | 5 | | 7 | | 9 | | 11 |
|---|---|---|---|---|---|---|---|---|---|---|---|---|
| DOUT 2 | | 1 | | 3 | | | 6 | | 8 | | 10 | |
| PIN | 0 1 2 3 4 | | | | | 5 6 7 8 9 10 11 | | | | | | |
| POUT | | | | | | 0 1 2 3 4 5 6 7 8 9 10 11 | | | | | | |

SHIFT REGISTER TYPE MEMORY DEVICE CONSISTING OF A PLURALITY OF MEMORY CHIPS

BACKGROUND OF THE INVENTION

1. Field of the Invention

This invention relates to a shift register type memory device consisting of a plurality of memory chips.

2. Description of the Prior Art

The technique wherein dummy minor loops are disposed in a magnetic bubble memory device employing the major-minor organization and wherein in the case of the presence of a defect minor loop, the dummy loop is used in place thereof, has been already described in U.S. Pat. No. 3,792,450 and U.S. Patent Application Ser. No. 675,338 now U.S. Pat. No. 4,125,875. In the former patent, the positions of defect loops are stored by arraying "1" and "0" in the order of minor loops in correspondence with good and defective loops. In the latter patent, the defective loop positions are coded into binary numbers and are stored. The latter patent has a shorter access time.

For the purposes of eliminating noises and enhancing the transfer speed, two chips are usually connected to a single sense amplifier, and data written into the chips is read out alternately from the two chips one by one. That is, data at even bit position is read out from the first chip, and data at odd bit positions from the second chip. Signals thus obtained are added up by the amplifier, converted into unipolar pulses by a rectifier, and converted into digital signals by a discriminator.

When both the two chips are non-defective, output signals at correct bit positions are obtained.

However, when either of the chips has a defect, the situation becomes different. Assume that a minor loop for providing data at bit position No. 4 of the first chip is defective. When the data is entered into the next minor loop, the data appears at bit position No. 6, and data at bit position No. 6 appears at No. 8.

In order to solve such a problem, there has been adopted a measure wherein data pulse trains from the respective chips are made separate and independent, pulse train rearrangement circuits are disposed for the respective pulse trains, and lastly, the two pulse trains corrected by the circuits are added.

Such a dummy loop control system has the disadvantage that a pulse train rearrangement circuit is required for each chip. Thus, a large number of pulse train rearrangement circuits are required in a large-capacity memory device employing many chips, resulting in a tremendous cost.

SUMMARY OF THE INVENTION

An object of this invention is to provide a shift register type memory which, even when simultaneously operating a large number of chips as described above, can rearrange the trains of pulses into the correct order by means of a simple single pulse train rearrangement circuit.

In order to accomplish this object, according to this invention, in recording data into a plurality of chips including a defect loop, a memory device is employed in which, when a predetermined loop within a chip designated to store certain data therein is defective, the data is not stored in the loop in the chip next to the defective loop, but is stored in a loop to be subsequently read out in a chip to be read out subsequently to the defective chip.

While other features and advantages of this invention will become more apparent from the following description of embodiments taken in conjunction with the accompanying drawing, it is to be understood that they are merely for illustration and that various modifications and improvements can be made without departing from the spirit of this invention.

DESCRIPTION OF THE PREFERRED EMBODIMENTS

Embodiment 1

This invention will be described by taking as an example a case where loop No. 3 of the first chip and loop No. 55 of the second chip with the initial loop reckoned as No. 0 are defect loops and where the other loops of the first and second chips are normal.

Figure 1:
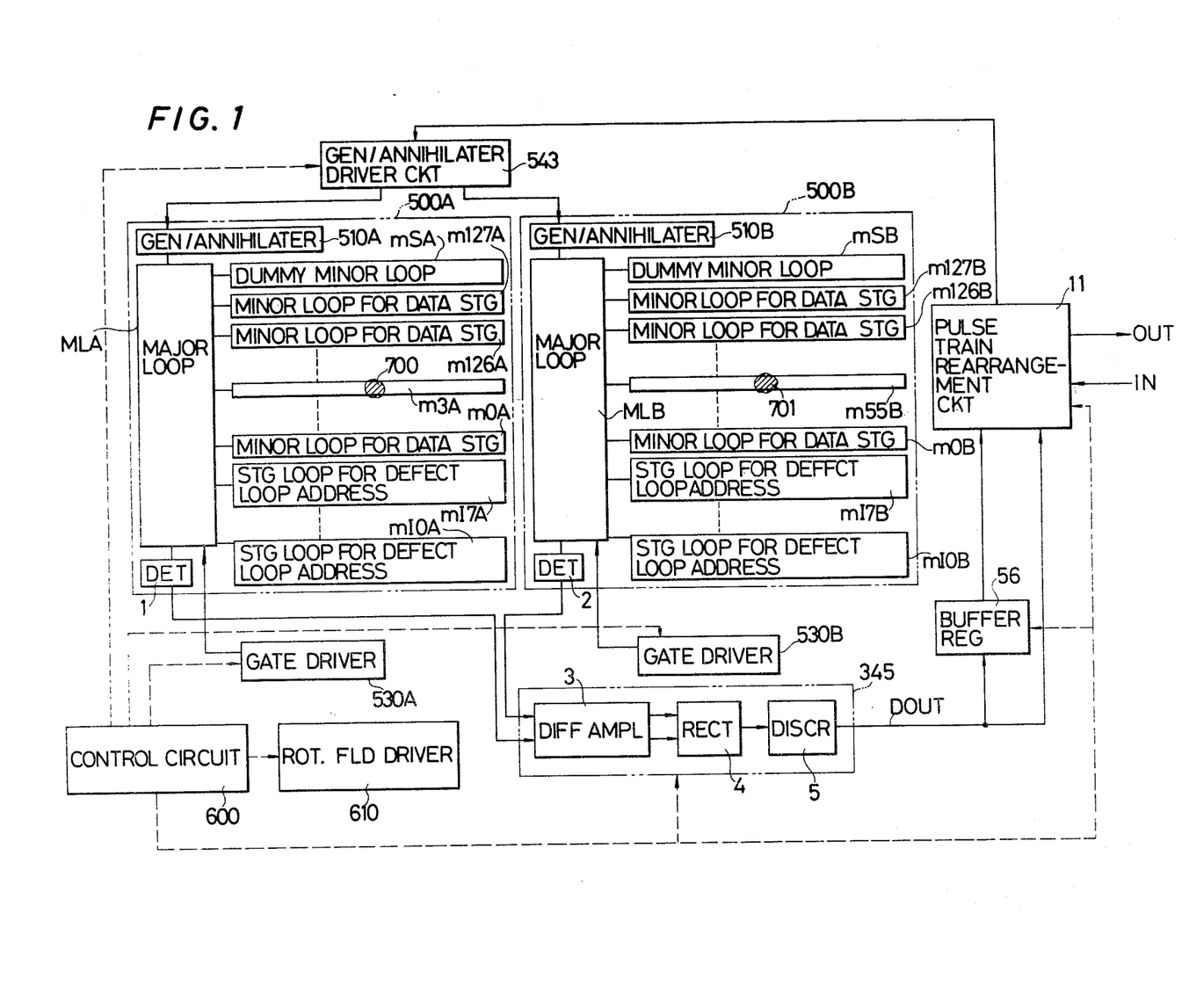
FIG. 1 is a block diagram which shows the construction of a magnetic bubble memory device consisting of two chips.

FIG. 1 is a block diagram which shows the construction of a magnetic bubble memory device composed of a pair of chips. Notwithstanding that the device involves defect loops, it is operated as if it consisted only of normal loops.

Here, numerals 1 and 2 designate detectors or more generally read-out means; symbols 510A and 510B generators/anihilators or more generally write-in means, symbols 500A and 500B chips of unit memories, symbols MLA and MLB major loops, symbols m0A-m127A and m0B-m127B minor loops or more generally shift registers for data storage, symbols mSA and mSB dummy minor loops or more generally dummy shift registers, numeral 600 a control circuit, numeral 610 a rotating field driver for synchronously driving the shift registers, numeral 345 a sense amplifier, symbols 530A and 530B gate drivers, numeral 543 a generator/anihilator driver circuit or more generally write-in control device, numeral 11 a pulse train rearrangement circuit, symbols mI0A-mI7A and mI0B-mI7B storage loops or more generally shift registers for defective loop or shift register addresses, and numeral 56 a buffer register. The contents of the storage loops for defect loop addresses are detected by the detectors 1 and 2, and are stored in the buffer register 56 through the sense amplifier 345.

The sense amplifier 345 or more generally the read-out control means is made up of a differential amplifier 3, a rectifier 4 and a discriminator 5. The rectifier 4 converts bipolar pulses coming forth from the amplifier 3 into unipolar pulses. The discriminator 5 amplitude-discriminates the unipolar pulses to judge whether they are "1" or "0" and puts them into a digital pulse signal.

Data of bit positions No. 0, No. 2, No. 4, x (no data is stored on account of a defect loop), No. 7. No. 9, ..., No. 107, No. 109, No. 110, No. 112, ..., and No. 254 are successively stored in advance in the loops m0A, m1A, m2A, ..., m126A, m127A, and mSA of the first chip 500A, while data of bit positions No. 1, No. 3, No. 5, No. 6, No. 8, ..., No. 108, x (no data is stored on account of a defect loop), No. 111, No. 113, ..., and No. 255 are successively stored in the loops m0B, m1B, m2B, ..., m126B, m127B, and mSB of the second chip 500B.

Figure 2A:
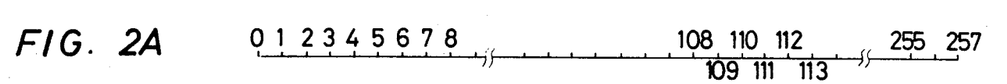
FIG. 2A is a diagram which shows the timing in FIGS. 2B to 2E, FIGS. 2B and 2C are diagrams which show the timings of outputs from first and second detectors, respectively.
Figure 2B:
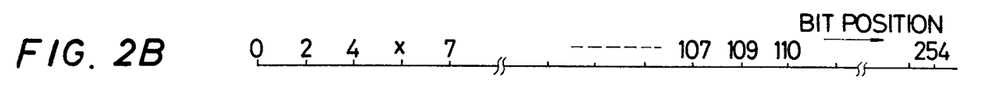
Figure 2C:
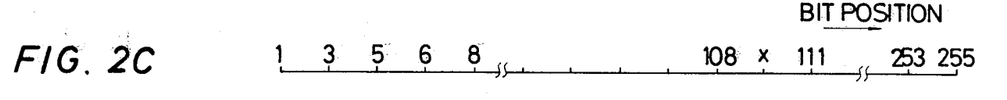
Figure 2D:
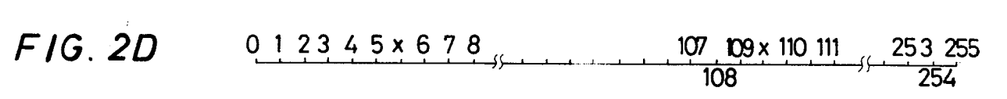
FIG. 2D is a diagram which shows the timing of an output with the combined outputs of the first and second detectors.
Figure 2E:
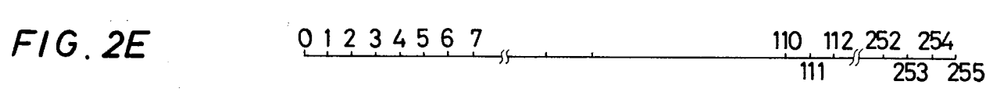
FIG. 2E is a diagram which shows the timing of an output obtained by correcting the output in FIG. 2D through a pulse train rearrangement circuit.

From the detectors 1 and 2 of the two chips 500A and 500B storing such data, bit information of numerical values illustrated respectively in FIG. 2B and FIG. 2C are provided as outputs with a timing as shown in FIG. 2A. When they are discriminated by the discriminator 5, an output as shown in FIG. 2D is obtained. When it is processed by the pulse train rearrangement circuit 11, an output of a correct order as shown in FIG. 2E is obtained. Although the trains of read-out data pulses are alternately read out from the two chips, the read-out is quite equivalent to the case of read-out from a single chip at a double frequency when the output shown in FIG. 2E is observed. Accordingly, it does not pose a problem that the two chips connected to the single sense amplifier and read out at the same time are considered to be the single chip operating at the double frequency and that when a certain bit position corresponds to a defect loop, the adjacent bit position (in fact, it is not the adjacent loop, but it lies in the adjacent chip) is used in place thereof, each of the succeeding data being delayed by one bit position. As this time, the data from even bit positions does not always come forth from the detector 1, but this is not problem, either. This situation is illustrated in FIG. 2D. The data from the defect loop intervening between bit positions Nos. 5 and 6 is discarded in the final output of FIG. 2E by the pulse train rearrangement circuit 11, so that the data read out is put into the normal form. That is, when the defect loop exists, the dummy loop to replace it need not lie within the same chip. The trains of data pulses coming forth from the identical sense amplifier are regarded as the train of data pulses coming forth from the single chip, whereby the rearrangement of the pulse trains can be done by the single pulse train rearrangement circuit. Such pulse train rearrangement circuit is described in detail in U.S. Patent Application Ser. No. 675,338.

In FIG. 1, each chip is provided with one dummy loop mSA, mSB. However, this is of course for mere illustration, and a plurality of dummy loops can be disposed as may be needed.

Address information on the defect loops are stored in the way stated below. On the assumption previously set forth, the loop m3A of the first chip 500A has a defect 700, and the loop m55B of the second chip 500B has a defect 701. Considering the two chips as if they were one chip, numbers are alternately assigned to the minor loops of the respective chips. Then, the data to be read out from the two chips has 256 bit positions, and bit position No. 6 (the position corresponding to the loop m3A of the first chip 500A) and bit position No. 111 (position corresponding to the loop m55B of the second chip 500B) with the initial loop reckoned as No. 0 are defective. In that case, defect loop addresses appearing in the output DOUT of the sense amplifier 345 become as shown as DOUT in FIG. 3. Only information at every second bit in the output comes from the first chip, and they have no significance in themselves. The composite pulse train from the joined two chips has significance for the first time.

Figure 3:
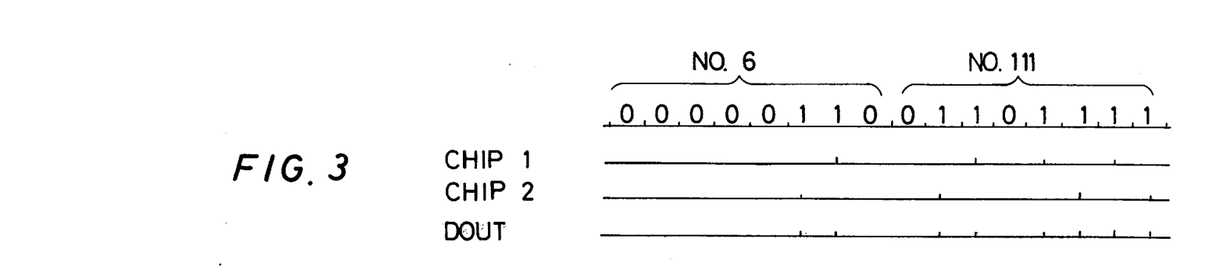
FIG. 3 is a diagram which shows the timing for the write-in of defective loop information.

Accordingly, when the binary codes of Nos. 6 and 111 are indicated and are alternately and separately stored in the first and second chips in advance and when they are alternately retrieved and are successively stored in the buffer register 56, then the numerical values of 6 and 111 are stored in the buffer register 56.

That is, "00010111" and "00101011" are respectively stored in the storage loops for defect loop addresses mI0A-mI7A and mI0B-mI7B.

Thereafter, the first and second chips are alternately read out. When the loop read out is No. 6 or No. 111, the pulse train rearrangement circuit 11 is so operated as to reduce the delay time of the transfer of each of the subsequent data by one clock.

When the data of the arrangement shown in FIG. 2E is supplied as write data, predetermined data must be stored in the first chip under the timing as shown in FIG. 2B, and predetermined data must be stored in the second chip under the timing as shown in FIG. 2C. To this end, address information for defect loops are read out, the pulse train rearrangement circuit is set according to the contents, and the write data in the correct order are rearranged into the pulse train as shown in FIG. 2D with the parts of the defect loops skipped over and then written in.

This may be done in such a way that the determination as to whether the loop of the chip into which the data is to be written is non-defective or defective is judged on the basis of the address information for the defect loops, and that when the particular loop is defective, the data is not stored in the chip, but is stored in the loop of the other chip next to a loop having stored the immediately preceding data, under the timing used for writing data into the other chip. By way of example, as illustrated in FIG. 2B, the data of bit position No. 6 ought to be written in the loop m3A of the chip 500A. However, when this loop is judged to be defective on the basis of the address information for defect loops, the delay times for pulses from Nos. 0 to 5 in the pulse train shown in FIG. 2E comprise two pulses while the pulses for No. 6 and thereafter have delay times reduced by one clock as illustrated in FIG. 2D. Further, the delay times of data for No. 110 and thereafter are reduced by one more clock.

In the actual writing, the serial write data thus obtained may be switched by a serial-parallel converter alternately under the timing signals shown to write data into the first and second chips and may be cyclically stored into the first and second chips.

Figure 4:
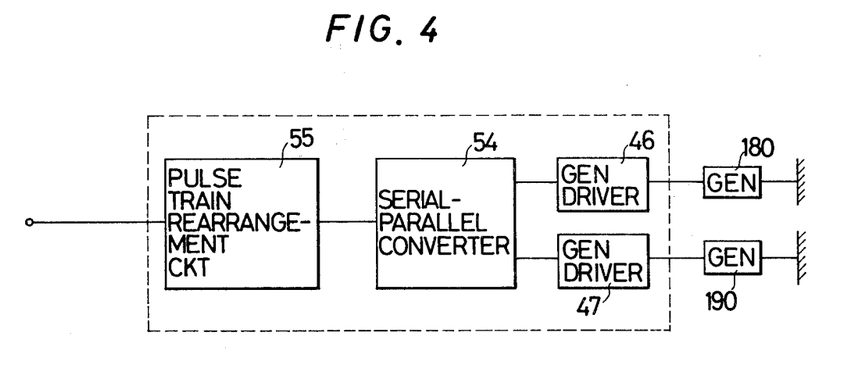
FIG. 4 is a block diagram of a write-in circuit for the device shown in FIG. 1.

The essential portions of such write-in circuit are shown in FIG. 4. Here, numeral 55 designates a pulse train rearrangement circuit, numeral 54 a serial-parallel converter, numerals 46 and 47 generator drivers, and numerals 180 and 190 generators. In order to store the data as shown in FIG. 2E in the memory of FIG. 1, the data are put into the output as in FIG. 2D by the pulse train rearrangement circuit 55, and the output data is alternately transmitted to the generators/annihilators 510A and 510B in FIG. 1 as in FIGS. 2B and 2C by the serial-parallel converter 54 and is alternately recorded into the first and second chips.

Embodiment 2

Figure 5:
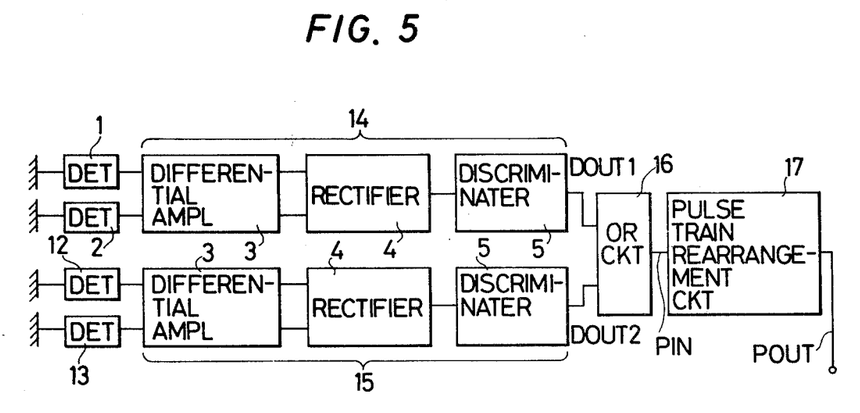
FIG. 5 is a block diagram of a device according to another aspect of the performance of this invention.
Figure 6:
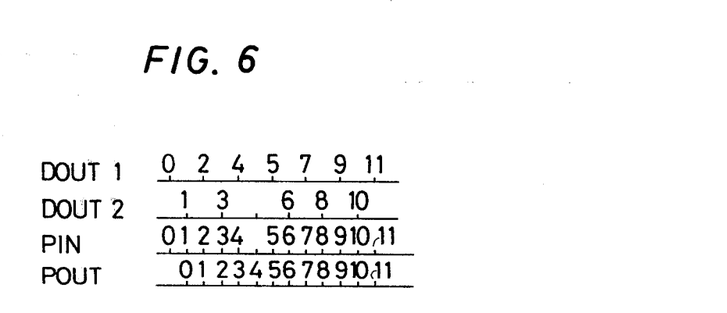
FIG. 6 is a diagram which shows the timings of outputs from the detectors in the device shown in FIG. 5, FIGS. 7 and 8 are block diagrams of devices according to further aspects of the performance of this invention.

This invention is applicable, not only between one pair of chips stated in Embodiment 1, but also between two pairs of chips as illustrated in FIG. 5. Chips having detectors 12 and 13 are ones which operate with a phase shift of 180 degrees from chips having detectors 1 and 2. (for example, ones which are packaged at an opposite position within one coil and under a state rotated by 180 degrees). Numerals 14 and 15 indicate sense amplifier systems each including a discriminator circuit. Depending on the property of the detectors or the method of constructing the sense amplifiers, the sense amplifier systems 14 and 15 can be partly or wholly made common. Here, for the sake of simplicity, the two sense amplifiers 14 and 15 are disposed independently, their outputs DOUT1 and DOUT2 are combined into one output PIN by an OR circuit 16, and a single pulse train rearrangement circuit 17 is disposed for the four chips. Data are loaded in the order of the first storage loop of the chip having the detector 1, the first storage loop of the chip having the detector 12, the first storage loop of the chip having the detector 2, the first storage loop of the chip having the detector 13, the second storage loop of the chip having the detector 1, and thereafter cyclically. Since the signal phase and the output DOUT1 being the composite signal of the outputs of the detectors 1 and 2 and that of the output DOUT2 being the composite signal of the outputs of the detectors 12 and 13 are shifted by 180°, the signal PIN comprising the outputs DOUT1 and DOUT2 combined becomes one train of data pulses. Accordingly, when the trains of data pulses successively read out from the four chips are considered to be the train of data pulses read out from a single chip at a quadruple frequency, the single pulse train rearrangement circuit may be disposed for the four chips. The operation is performed as shown in FIG. 6, and a predetermined output POUT is obtained in quite the same way as in FIGS. 2A–2E. Thus, the one and only pulse train rearrangement circuit suffices for the four chips, and in comparison with the case of disposing one pulse train rearrangement circuit for one chip as in the prior-art device, the number of pulse train rearrangement circuits can be diminished to ¼, and the cost can be sharply reduced. In this manner, it is not always necessary to perform the pulse train rearrangement for every sense amplifier, and as to arbitrary series data pulse trains, it may be considered that there is a chip of large area and speedy operation which a plurality of chips are connected together.

Embodiment 3

Figure 7:
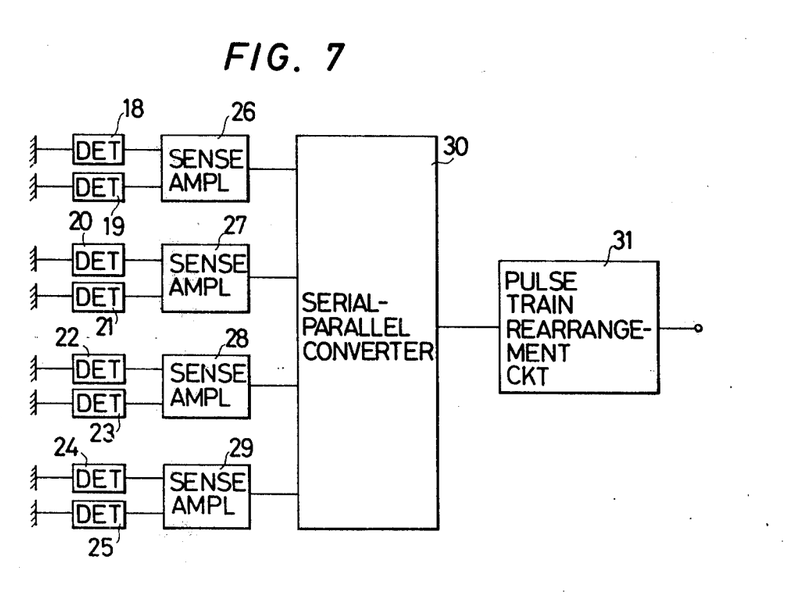

The number of chips usable in the device according to this invention is not limited to two pairs. It is possible that, as shown in FIG. 7, the outputs of a large number of sense amplifier systems operating in parallel can be entered into a parallel-serial converter 30 to form a series data pulse train, a single pulse train rearrangement circuit 31 being disposed therefor. Numerals 18 to 25 designate detectors operating in parallel, and numerals 26 to 29 represent the sense amplifier systems including discriminator circuits operating in parallel. The detectors 18–25 may be operated in parallel, and need not always provide detection waveforms in quite the same phases.

Embodiment 4

Figure 8:
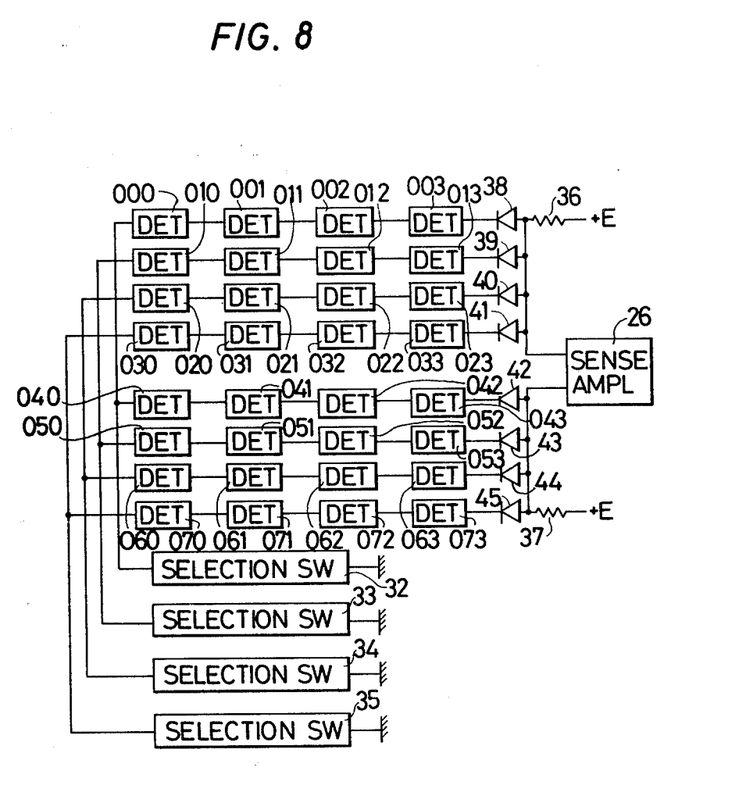

The sense amplifier system 26 in FIG. 7 has only the two detectors 18 and 19 connected thereto. In this respect, however, a large number of chips may be connected as shown in FIG. 8, and the same operation as in the device shown in FIG. 7 may be done for arbitrary two chips selected from among them. In FIG. 8, numerals 000 to 073 indicate detectors, numerals 38 to 45 selection diodes, numerals 36 and 37 resistors for supplying bias d.c. currents, and numerals 32 and 35 selection switches.

Figure 9:
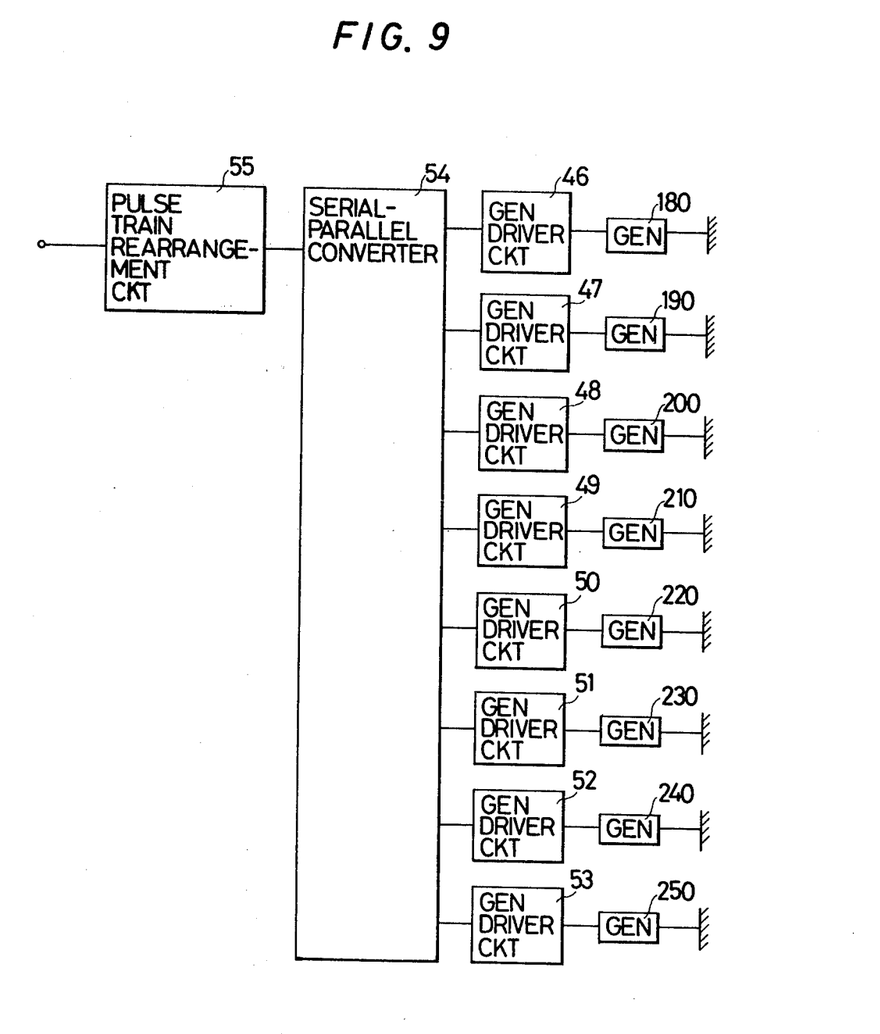
FIG. 9 is a block diagram of a write-in unit for the device shown in FIG. 7.

The write-in may be done as illustrated in FIG. 9. Here, numeral 55 indicates a pulse train rearrangement circuit, considerable parts of which can be used jointly with that at the read-out. Shown at 54 is a serial-parallel converter, which functions to distribute a series data pulse train among the chips operating in parallel. Numerals 46 to 53 denote generator driver circuits, and numerals 180 to 250 generators corresponding respectively to detectors 18 and 25. FIG. 9 corresponds to a write-in circuit in the case of FIG. 7. Also a write-in circuit corresponding to the read-out circuit in FIG. 8 can be constructed likewise to that in FIG. 9. In this case, composite pulse trains to be written into the plurality of chips are regarded as a single pulse train, whereby processing circuitry can be simplified as in the case of read-out.

In the embodiments thus far described, the addresses of defect loops have been fixed relative to the pulse train rearrangement circuit beforehand. More specifically, in the case of FIG. 1 or FIG. 5, the group of chips (1 and 2, or 1, 2, 12 and 13) for read-out or write-in always operates at the same time as the pulse train rearrangement circuit, so that the defect loop addresses are always constant and fixed when viewed from the pulse train rearrangement circuit. Accordingly, the defect loop addresses are stored in a defect loop address storage device in the form of interconnections. In the case of FIG. 8, however, two chips operate simultaneously among the thirty-two chips connected to the single sense amplifier system 26, and sixteen kinds of selections are carried out in dependence on chip addresses externally designated. Accordingly, the positions (loop addresses) of defect loops are different in dependence on the selected chips, so that the operation of the pulse train rearrangement circuit 17 must be switched according to the selected chips. That is, all the address information of the defect loops of the thirty-two chips need be accumulated in the defect loop storage device in the pulse train rearrangement circuit in advance before the read-out of data. When chips are selected, the address information of the defect loops of the chips are read out and are set in a control flip-flop determining the operation sequence of the pulse train rearrangement circuit. Even in case of pulse trains from two or more chips as in the case of FIG. 7 or FIG. 8, the concept of pulse trains applies as in the case of FIG. 5.

Embodiment 5

Figure 10:
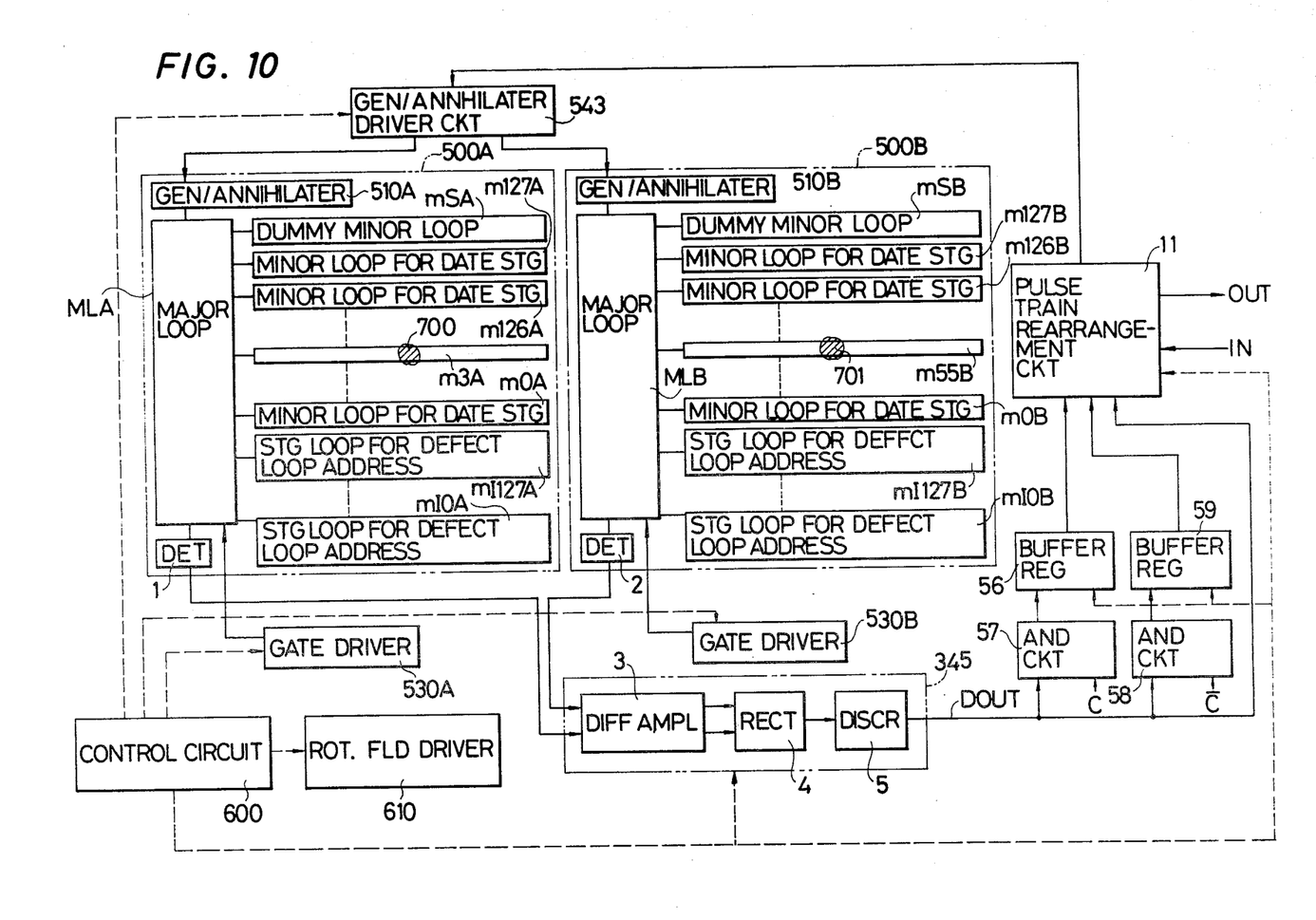
FIG. 10 is a block diagram of a device according to a still further aspect of the performance of this invention.

In the above embodiments, all the address information for defect loops have been stored in binary numbers. The address information for defect loops, however, may be stored in any form. FIG. 10 shows such an example. Except that the same number of storage loops for defect loop addresses mI0A-mI127A and mI0B-mI127B as that of minor loops for data storage m0A-m127A and m0B-m127B are required and that two AND circuits 57 and 58 and two buffer registers 56A and 56B are necessary for the read-out of the address information for defect loops, the present embodiment is quite the same as the device shown in FIG. 1. The same reference numerals as in FIG. 1 signify the same parts as in FIG. 1.

All the loops which constitute the defect loop address storage device store identical data "1" or "0". That is, assuming as in Embodiment 1 that the minor loop m3A of the chip 500A and the minor loop m55B of the chip 500B are defective, "0" is stored in only the storage loops for defect loop addresses mI3A and mI55B, and "1" is stored in all the other storage loops for defect loop addresses.

Both the data information and the address information for defect loops appear at the output DOUT of the discriminator 5. At the read-out operation, the address information for defect loops are read out from the detectors 1 and 2 provided in the respective memory chips, and the information of the output DOUT are alternately set in the two buffer registers 56 and 59 through the AND circuits 57 and 58 by two clocks C and C, whereby the defect loop information of the respective chips can be separately obtained. The data DOUT thereafter read out has the pulse train restored to be normal by the pulse train rearrangement circuit 11 by using the outputs of the buffer registers 56 and 59. That is, when the data out from a certain loop of the first chip is provided from the output DOUT, whether or not the loop is defective is known by reading out the buffer register 56. It is quite the same as in the prior-art pulse train rearrangement circuit that, when the loop is defective, the pulse train rearrangement circuit reduces the delay time by one clock.

When the data from a certain loop of the second chip is provided from the output DOUT by the next clock, the buffer register 59 is read out, and the same operation as set forth above is conducted. Thereafter, the buffer registers 56 and 59 are alternately switched and used. Then, the stored data can be read out in quite the same manner as in Embodiment 1.

Although, in the above examples, description has been made of the case of disposing the defect loop address storage device on the memory chip, it is a matter of course that the storage device can be realized by the use of a separate and independent memory.

The magnetic bubble chip of the major-minor minor organization is sometimes used in such a manner that only one bit is read out from or written into one chip. In this case, read-out data or write-in data is expressed by the presence of a single electric pulse or a plurality of parallel electric pulses. Here in this specification, also such pulses shall be defined as a pulse train. Also in this case, the bubble train is in the form with the parts of defect loops skipped over, together with the read-out data and the write-in data, and the difference is that the electrical pulse appears only at one designated bit in the train. Also in this case, accordingly, the pulse train rearrangement circuit is necessary, and this invention is applicable.

Although, in the foregoing embodiments, this invention has been explained on the magnetic bubble memory device, it is obvious that this invention is similarly successfully applicable to any other shift register type memory such as charge coupled device.

What is claimed is:

1. A memory device comprising:
   a group of unit memories, said each unit memory including:
   a plurality of shift registers for data storage;
   at least one dummy shift register;
   a defect shift register address storage device which stores the positions of defect shift registers among said plurality of shift registers;
   write-in means for writing data into said shift registers, and said defect shift register address storage device;
   read-out means for reading out the data of said shift registers and said defect shift register address storage device;
   a first transfer path for coupling said write-in means with said shift registers and said defect shift register address storage device;
   a second transfer path for coupling said read-out means with said shift registers and said defect shift register address storage device;
   means for synchronously driving the shift registers, the defect shift register address storage device, and the transfer paths;
   write-in control means for driving the plurality of write-in means by successively switching them in a predetermined sequence, said write-in control means being so constructed that, when a predetermined shift register into which a predetermined information is to be written is found to be defective on the basis of the information of said defect shift register address storage device, said predetermined information is transferred to the write-in means corresponding to the shift register into which the information following said predetermined information would be stored if said predetermined shift register were not defective;
   read-out control means for successively driving the plurality of read-out means in the same sequence as that of said write-in control means, and
   a pulse train rearrangement circuit provided commonly to said plurality of unit memories, which when receiving an input signal pulse train, arranges it according to the information from said defect shift register address storage device in order to transfer it to said write-in control means, and when receiving an output pulse train from said read-in control means, rearranges it to a same pulse train as said input signal pulse train.

2. A memory device according to claim 1, further comprising a serial-parallel converter between said pulse train rearrangement circuit and a plurality of write-in control means.

3. A memory device according to claim 1, wherein the positions of the defect shift registers stored in said defect shift register address storage device are binary coded.

4. A memory device according to claim 3, wherein the binary-coded information of the positions of the defect shift registers are loaded into said defect shift register address storage device provided in the respective unit memories in the same sequence as that of said data, and before data read-out, they are read out in the same sequence as that of the data read-out and are stored into one buffer register corresponding to at least one pair of unit memories.

5. A memory device according to claim 1, wherein buffer registers for accumulating detection outputs from the defect shift register address storage device provided in the respective unit memories are disposed in correspondence with said respective unit memories, and said pulse train rearrangement circuit is controlled on the basis of said buffer registers.

6. A memory device according to claim 1, wherein said read-out control means are constructed of a plurality of sense amplifier systems provided for every pair of unit memories, and a common parallel-serial converter for serializing outputs of the respective sense amplifier systems.

7. A memory device according to claim 1, wherein said group of unit memories is made up of a first partial unit memory group comprising a plurality of unit memories and a second partial unit memory group comprising a plurality of remaining unit memories, said read-out control means is constructed of selection means for causing only a predetermined unit memory among each of the partial memory groups to deliver an output and a sense amplifier system for differentially detecting the two selected outputs, and the single pulse train rearrangement circuit is disposed for said sense amplifier system.

8. A memory device according to claim 1, wherein said first and second transfer paths are constructed of a common closed loop.

9. A memory device according to claim 1, wherein said unit memory is a magnetic bubble memory which stores data in accordance with the state of existence of magnetic bubbles on a magnetic material.

* * * * *